United States Patent [19]

Hietala et al.

[11] Patent Number: 5,055,802
[45] Date of Patent: Oct. 8, 1991

[54] MULTIACCUMULATOR SIGMA-DELTA FRACTIONAL-N SYNTHESIS

[75] Inventors: Alexander W. Hietala, Palatine; Duane C. Rabe, Rolling Meadows, both of Ill.

[73] Assignee: Motorola, Inc., Schaumburg, Ill.

[21] Appl. No.: 516,993

[22] Filed: Apr. 30, 1990

[51] Int. Cl.[5] .............................................. H03L 7/18
[52] U.S. Cl. ........................................ 331/16; 331/25; 332/127; 455/76; 455/119
[58] Field of Search ........................... 331/1 A, 16, 25; 332/127; 455/42, 76, 119

[56] References Cited

U.S. PATENT DOCUMENTS

| 4,179,670 | 12/1979 | Kingsbury | 331/10 |
| 4,204,174 | 5/1980 | King | 331/10 |
| 4,573,023 | 2/1986 | Cok et al. | 331/1 A |
| 4,609,881 | 9/1986 | Wells | 331/1 A |
| 4,758,802 | 7/1988 | Jackson | 331/10 |
| 4,800,342 | 1/1989 | Jackson | 331/10 |
| 4,810,977 | 3/1989 | Flugstad et al. | 455/113 X |
| 4,815,018 | 3/1989 | Reinhardt et al. | 364/701 |
| 4,816,774 | 3/1989 | Martin | 331/1 A |
| 4,870,384 | 9/1989 | Thomas | 332/123 |
| 4,965,531 | 10/1990 | Riley | 331/1 A |

FOREIGN PATENT DOCUMENTS 0038520 10/1981 European Pat. Off. .

OTHER PUBLICATIONS

J. Candy, "A Use of Double Integration in Sigma Delta Modulation", IEEE Transactions on Communications, vol. Com 33 No. 3, Mar. 1985 pp. 249-258.

Primary Examiner—Siegfried H. Grimm
Attorney, Agent, or Firm—Raymond A. Jenski; Rolland R. Hackbart

[57] ABSTRACT

A fractional-N synthesizer employing at least a second order sigma-delta modulator is disclosed. The most significant bits from the output accumulator of the sigma-delta modulator are used as the carry out control for the variable divisor of the loop divider. Modulation to the synthesizer is introduced as part of the digital number input to the sigma-delta modulator and spurious signal output is reduced by selection of a large number as the denominator of the fractional portion of the loop divider divisor.

41 Claims, 4 Drawing Sheets

MULTIACCUMULATOR SIGMA-DELTA FRACTIONAL-N SYNTHESIS

BACKGROUND OF THE INVENTION

This invention relates generally to frequency synthesizers and more particularly to a fractional-N frequency synthesizer with cascade sigma-delta modulator style accumulators which may be employed in radiotelephone communications equipment to generate one of a plurality of signals for use by the radio frequency transceiver.

Phase-locked loop (PLL) frequency synthesis is a well known technique for generating one of many related signals from a frequency variable voltage controlled oscillator (VCO). In a single loop PLL, an output signal from the VCO is coupled to a programmable frequency divider which divides by a selected integer number to provide a frequency divided signal to a phase detector. The phase detector compares the frequency divided signal to a reference signal from another fixed frequency oscillator which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized. Since the programmable divider divides by integers only, the output frequency step size is constrained to be equal to the reference signal frequency.

With the single loop PLL, an engineering compromise must be struck between the competing requirements of loop lock time, output frequency step size, noise performance, and spurious signal generation.

In order to overcome the limitations of the single loop PLL, programmable frequency dividers capable of effectively dividing by non-integers have been developed. Output frequency step sizes which are fractions of the reference signal frequency are obtained while maintaining a high reference frequency and wide loop bandwidth. A discussion of fractional-N synthesis may be found in U.S. Pat. No. 4,816,774. As described therein, two accumulators are employed to simulate the performance of fractional synthesis of the switching between different integer values of divisors without the attendant spurious signals generated by such switching. The two accumulator technique acts to reduce the unwanted spurious signals by cancellation and loop filter rejection.

The reference signal frequency for the fractional-N frequency synthesizer is, therefore, determined by the step size of the VCO output frequency multiplied by the denominator of the programmable divider divisor. Fractional-N synthesis allows the use of a reference frequency which is much higher than the actual channel spacing and allows designs to use wider bandwidths due to the reduction of low frequency spurious outputs. Wider bandwidths allow fast lock times and the possibility of wideband modulation applied to the reference input or the fractional division scheme.

Unfortunately, this system is not perfect and generates some spurious signal output at a frequency equal to the channel spacing. The desired signal output purity is better than the non-fractional system, but by itself may still be insufficient for some high-quality systems.

In order to minimize the effects of this spurious output, two accumulator fractional-N synthesis systems have been developed which spread out the spurious signals to frequencies at which filtering is inexpensive and simple. By using systems with more than two accumulators this benefit can be extended even further.

Figure 1:
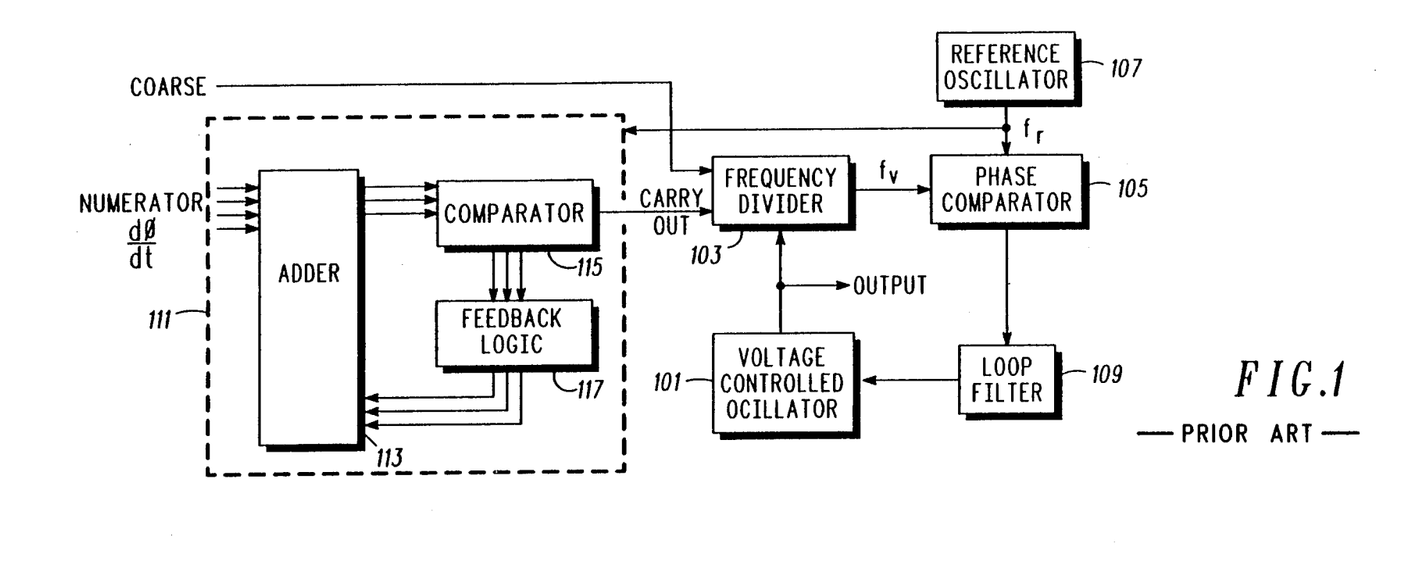
FIG. 1 is a block diagram of a first order fractional-N synthesizer.

The basic structure of a one-accumulator fractional-N system is shown in the block diagram of FIG. 1. A VCO 101 generates an output signal which, typically is coupled to a fully programmable frequency divider 103 which has an output to a phase detector ($\phi$) 105. The control input is a summation of a coarse channel setting and the output of the digital network which provides the fractional part of the division. The phase detector 105 conventionally compares the phase of the divided frequency, $f_v$, to the phase of the reference signal frequency $f_r$ output from a reference oscillator 107 to produce a signal which is applied to a loop filter 109 and subsequently to the VCO 101 to phase-lock the VCO output signal.

The selection of the divisor value of variable frequency divider 103 is made by digital network 111 which, in previously known implementations such as described in Z-transform equivalent in U.S. Pat. No. 4,758,802, comprises a conventional adder 113, a comparator 115 (which produces a "carry out" signal when the input to the comparator 115 exceeds a given numerical value), and feedback logic 117 which subtracts the denominator (if a carry output occurs) from the digital number representation output from adder 113 and comparator 115 before applying the digital number representation to the adder 113. A second digital number representation, which in a fractional-N synthesizer is the digital equivalent of the first differential of the offset phase with respect to time (the offset frequency), is applied to another input of the digital network 111. The overall effect of the digital network 111 is to integrate the differential phase and to apply to the PLL a control signal (in the form of a carry-out digital signal) which is a first order equivalent of the phase offset. The adder 113 sums the previous contents of the adder 113 with $d\theta/dt$ (a numerator) on each occurrence of the reference frequency signal $f_r$. As described in U.S. Pat. No. 4,816,774, the adder 113 output is compared to a number (a denominator of a desired fractional part of the divisor when the divisor of frequency divider 103 is expressed as a sum of N and [numerator/denominator]). If the adder 113 contents exceed the denominator then the carry output is set true and the contents of the adder is reduced by the denominator in feedback logic 117 before the next reference pulse occurs.

As an example, assume the denominator is 13 and the numerator is 1. On every thirteenth reference pulse, the adder 113 exceeds the denominator and generates a carry output which will increase the divisor of the frequency divider 103 by one for one reference signal, $f_r$, pulse. This removes one pulse from the VCO 101 output signal and thus reduces the accumulated phase error by 360 degrees. This corresponds to a 1/13 division added to the nominal division number.

Figure 2:
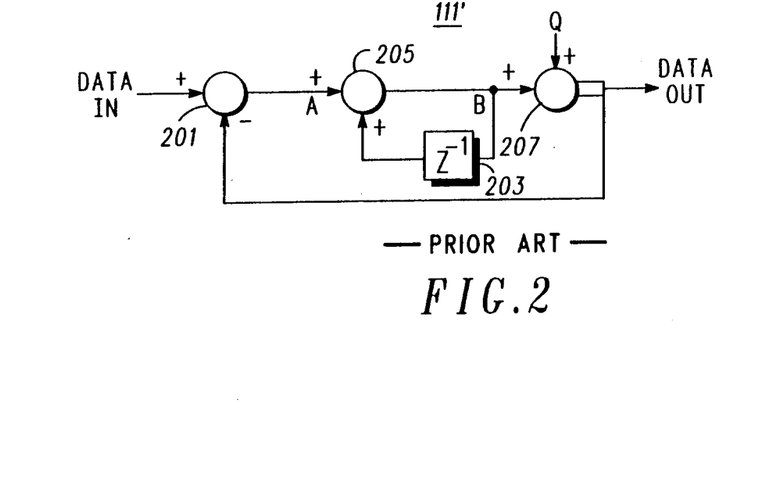
FIG. 2 is a Z-transform diagram equivalent of the digital network of FIG. 1.

Shown in the Z-transform diagram of FIG. 2 is a Z-transform equivalent digital network 111' of this one accumulator system consistent with that disclosed in U.S. Pat. No. 4,758,802. The Z-transform equation for the single accumulator system is:

$$DO = \frac{DI}{(2-Z^{-1})} + \frac{Q(1-Z^{-1})}{(2-Z^{-1})}$$

The Z-transform adder 201 is fed from the numerator (minus the denominator if an overflow occurs) and the previous adder contents represented by a $z^{-1}$ (delay) block 203, and adder 205. The comparison is considered to be a digital slicer with quantization error Q added at 207. The output from adder 207 is the digital number fed back to adder 201 and the carry out signal is taken as the output signal. For Z-transform analysis, however, no difference need be made between the output and the feedback signals.

At point B an equation can be written as follows:

$B(z) = B(z)z^{-1} + A(z)$ or $B(z) = A(z)/(1-z^{-1})$

But

Data out $= B(z) + Q$ and $A(z) = $ Data in $-B(z) - Q$

Substituting this in and solving for B(z) then:

$B(z) = $ Data in$/(2-z^{-1}) - Q/(2-z^{-1})$

And solving for Data out:

Data out $=$ Data in$/(2-z^{-1}) + Q(1-z^{-1})/(2-z^{-1})$

This equation may now be converted to the frequency domain (Note that "v" is frequency normalized to the folding frequency):

Mag.(Data out/Data in) $= 1/(5 - 4 \cos(PI^*v))^{\frac{1}{2}}$

Mag.(Data out/Q) $= \{(2-2\cos(PI^*v))/(5-4\cos(PI^*v))\}^{\frac{1}{2}}$

Thus, the data into adder 201 is slightly low pass filtered and the quantization noise introduced by the digital network 111' is high pass filtered. The high pass filtering of the quantization noise has the effect of reducing the spurious signals occurring at the frequency of the channel-to-channel frequency spacing of the transceiver if the spurious occurs at a frequency much below the corner of the high pass. By selecting a PLL response with a low pass corner frequency much lower in frequency than the high pass corner it is possible to reject almost all of the noise. In a single accumulator system, the high pass roll-off is 20 db/decade. Thus, the reference frequency must be large to push the high pass corner to large frequencies, if sufficient noise suppression is to be obtained. (Or the PLL low pass must be very low in frequency and thus lose the benefits of wide bandwidth).

To improve the high pass filtering of the basic fractional structure, it has been known to use fractional-N synthesis for systems using two accumulators. A two-accumulator fractional-N synthesizer is disclosed in U.S. Pat. No. 4,204,174. Also, an example of one is shown in the block diagram of FIG. 3 which replaces the single digital network 111 of FIG. 1.

Figure 3:
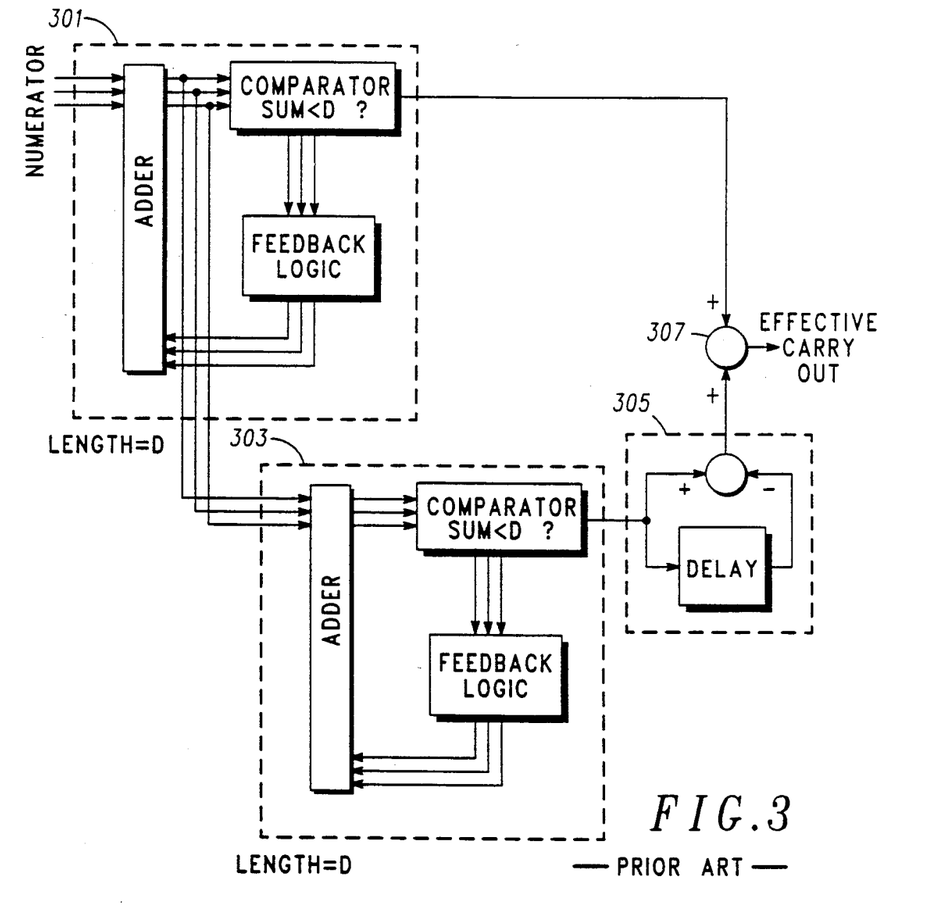
FIG. 3 is a block diagram of a second order fractional-N synthesizer.

In a dual accumulator system, the contents of the first accumulator 301 becomes the Data input to the second accumulator 303. The second accumulator 303 has its own Z-transform quantization error, Q2, in addition to the error of, Q1, the first accumulator. However, both of these errors will be reduced from the single accumulator case. The carry-output from the second accumulator 303 is applied to the digital logic element 305 and, after the differentiation produced by logic element 305, added to the carry-output of the first accumulator 301 in adder 307 to produce the effective carry-out signal to be applied to frequency divider 103. Thus, the effect produced by the dual accumulator is to add the first order phase offset of the carry-output of accumulator 301 and the second order phase offset of the differentiated carry-output of accumulator 303 for the effective carry-out signal.

Figure 4:
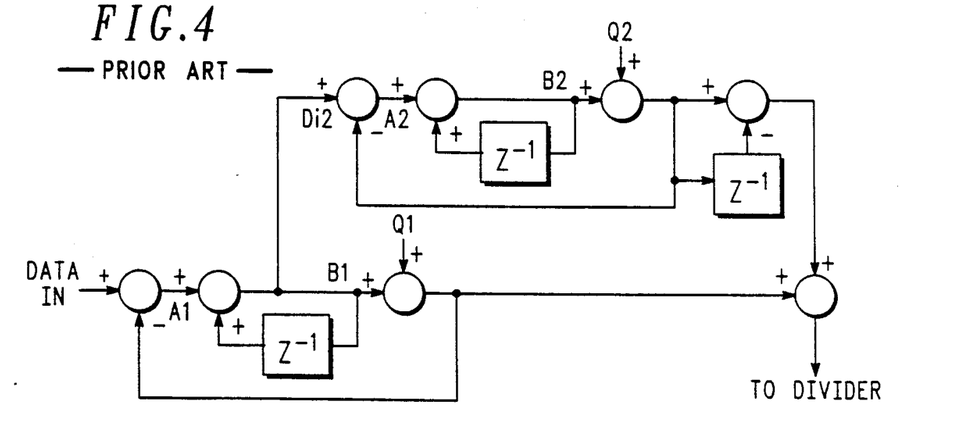
FIG. 4 is a Z-transform diagram equivalent of the digital network of FIG. 3.

The Z-transform model of this two accumulator ripple system is shown in the diagram of FIG. 4. DO1 is the Data out of the first accumulator. From the above calculation:

DO1 = Data out = Data in$/(2-z^{-1}) + Q1(1-z^{-1})/(2-z^{-1})$

Di2 is the accumulator contents of the first accumulator (which is the input of the second accumulator).

$Di2 = ($Data in$-DO1)/(1-z^{-1})$

A similar equation to that above for DO2 is:

$DO2 = Di2/(2-z^{-1}) + Q2(1-z^{-1})/(2-z^{-1})$

Substituting in the expression for Di2 and then substituting in for DO1:

DO2 = Data in$/\{(2-z^{-1})(1-z^{-1})\} + Q2(1-z^{-1})/(2-z^{-1})$ $-$ Data in$/\{(2-z^{-1})^2(1-z^{-1})\} - Q1/(2-z^{-1})^2$ But:

$DO3 = DO2(1-z^{-1})$ and

Data out $= DO1 + DO3$

Thus after some algebra:

Data out = Data in$\{(3-2z^{-1})/(2-z^{-1})^2\} + Q1\{(1-z^{-1})^2/(2-z^{-1})^2\} + Q2\{(1-z^{-1})^2/(2-z^{-1})\}$ This representation is then converted to the frequency domain (Once again "v" is the frequency normalized to the folding frequency):

Mag.(Data out/Data in) $= (13 - 12 \cos(PI^*v))^{\frac{1}{2}}/(5-4\cos(PI^*v))$

Mag.(Data out/Q1) $= (2-2\cos(PI^*v))/(5-4\cos(PI^*v))$

Mag.(Data out/Q2) $= (2-2\cos(PI^*v))/(5-4\cos(PI^*v))^{\frac{1}{2}}$

In this case the high pass corner occurs at about the same frequency as in the one accumulator case but the frequency response of the high pass characteristic to the quantization noise is 40 db/decade. This allows the PLL to have a wider bandwidth. i.e.. allows the fractional system to operate at a lower frequency, than in the one accumulator case while still maintaining the desired noise suppression.

The number of accumulators can theoretically be increased to any desired order. The resulting response of the high pass characteristic to the quantization noise will be the number of accumulators times 20 db/decade. The accumulators are "recombined" in what is known as a "Pascal's triangle method" as disclosed in. U.S. Pat. No. 4,609,881. In general the higher order accumulators are recombined as $(1-Z^{-1})^{(n-1)}$.

Figure 5:
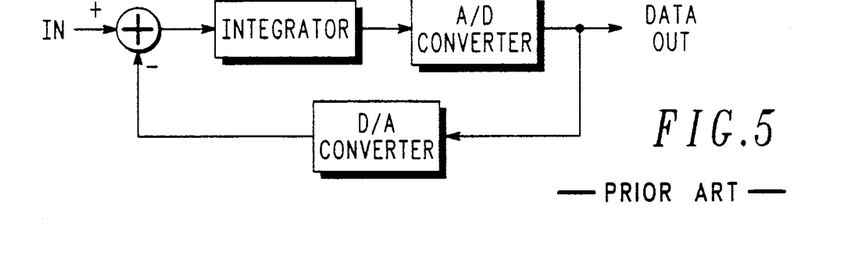
FIG. 5 is a block diagram of a conventional first order sigma-delta modulator useful in a D/A converter.

In a paper published by James C. Candy, "A Use of Double Integration in Sigma Delta Modulation", IEEE Transactions on Communications, Vol. Com. 33 No. 3, March, 1985, pp. 249-258, a function known as a sigma-delta modulator was shown to be an effective integration function in an analog to digital (A/D) converter. Sigma-delta modulators now form the basis of many modern A/D converters. Most of these sigma-delta modulators are first or second order with the integrators realized as analog systems as depicted in the block diagram of FIG. 5. The output of this system is typically passed through a digital filter to arrive at the desired digital output corresponding to the analog input level. It is to be observed that the entire digital number is both output and fed back thus making the disclosed A/D converter signal delta modulator unsuitable for fractional-N synthesizers.

Figure 6:
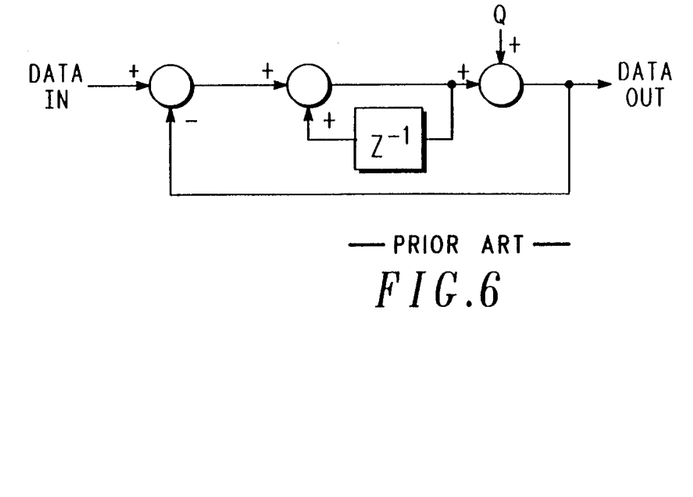
FIG. 6 is a Z-transform diagram equivalent of FIG. 5.

However, if this sigma-delta modulator were modeled in a sampled data implementation (as shown in FIG. 6), the resulting Z-transform equation would be:

$$DO = \frac{DI}{(2 - Z^{-1})} + \frac{Q(1 - Z^{-1})}{(2 - Z^{-1})}$$

which states that the data out is the data in delayed by one clock period plus a noise term with a first order high pass digital filter operating on the noise. This equation is remarkably similar to that of the single accumulator for fractional-N synthesis, and results in a Z-transform diagram such as that shown in FIG. 6.

Figure 7:
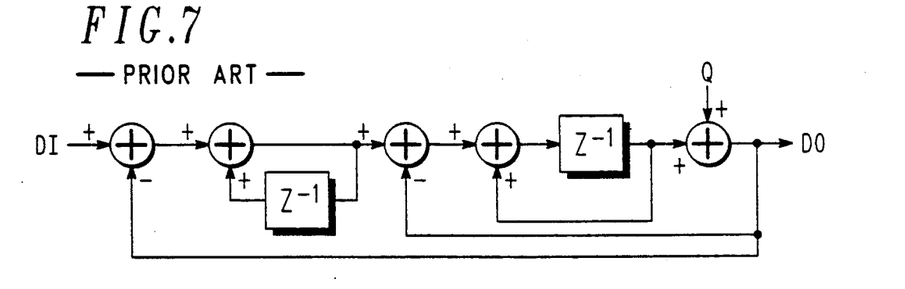
FIG. 7 is a Z-transform diagram for a second order sigma-delta modulator useful in a D/A converter.

Candy also discloses second order sigma-delta modulator A/D converters having a Z-transform diagram as shown in FIG. 7 and having a transfer function of $DO = Z^{-1}DI + Q(1-Z^{-1})^2$. This second order implementation also is unsuitable for fractional-N synthesis since the entire digital number is both output and fed back.

SUMMARY OF THE INVENTION

Accordingly, it is one object of the present invention to advantageously employ a sigma-delta modulator function in a fractional-N synthesizer.

It is another object of the present invention to introduce small increments of frequency offset into the fractional-N synthesizer.

These and other objects are realized in the fractional-N synthesizer of the present invention which encompasses a digital network which accepts a digital number presented as a first plurality of bits. First and second integrals are calculated and combined for the digital number and a predetermined number of output most significant bits are selected and coupled to the divisor control input of the loop divider.

DETAILED DESCRIPTION OF THE PREFERRED EMBODIMENT

The invention disclosed herein is of a multiaccumulator sigma-delta fractional-N synthesizer. By arranging ripple or latched fractional-N divider control circuits in a unique sigma-delta configuration, it is possible to realize the performance benefits of a standard fractional-N synthesizer.

A digital radio transceiver such as that useful in a digital radiotelephone system, may advantageously employ the present invention. The GSM Pan-European digital radiotelephone system requires radio equipment capable of rapid changes of frequency and uses GMSK modulation with BT=0.3 for the transmission of digital data and digitized voice. Typically, I-Q modulators have been employed to transmit digital data over radio systems. In such schemes, the digital data is converted into properly shaped I and Q pulses formed in look-up tables. The I and Q channels are then passed through a pair of quadrature-driven mixers to convert to an offset frequency. The outputs of the two mixers are then combined to form a composite GMSK modulated signal at the offset output frequency. This offset output frequency is then mixed to the desired transmitter output frequency.

To achieve rapid frequency changes, modulation, and low spurious signal and noise levels, a modulated multiaccumulator sigma-delta fractional-N synthesizer is employed in the present invention. For modulation, the synthesizer employs a look-up table to convert the data stream to be transmitted into frequency offsets for the fractional-N synthesizer. The loop division of the synthesizer is adjusted in accordance with the input data stream to follow the instantaneous frequency offset required for the GMSK modulated signal. This can be at the offset frequency or directly at the main frequency.

The fractional-N synthesizer configuration is operated upon with large accumulators to eliminate spurious signals, to provide D/A correction to reduce discrete spurious signals, and to provide direct digital modulation to the PLL. Either ripple or latched accumulators may be used in the present invention without affecting the scope of the invention.

Figure 8:
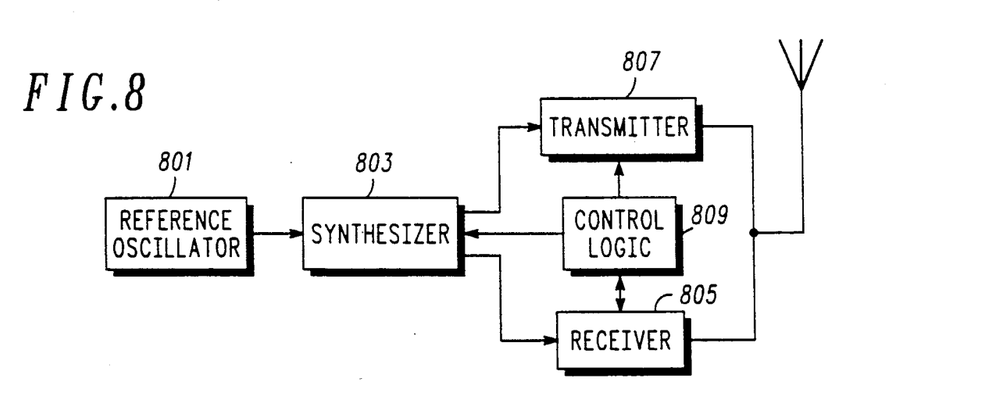
FIG. 8 is a block diagram of a radio transceiver which may employ the present invention.

A transceiver which may employ the present invention is shown in the block diagram of FIG. 8. A reference oscillator 801 provides a reference signal, $f_r$, which remains relatively constant in frequency over time and extremes of environment and is applied to frequency synthesizer 803. The output of the synthesizer is used by both the receiver 805 and the transmitter 807 to produce the local oscillator and the modulated transmit signal, respectively. Control over functions of the transceiver, such as channel of operation frequency, is provided by control logic 809 function.

Figure 9:
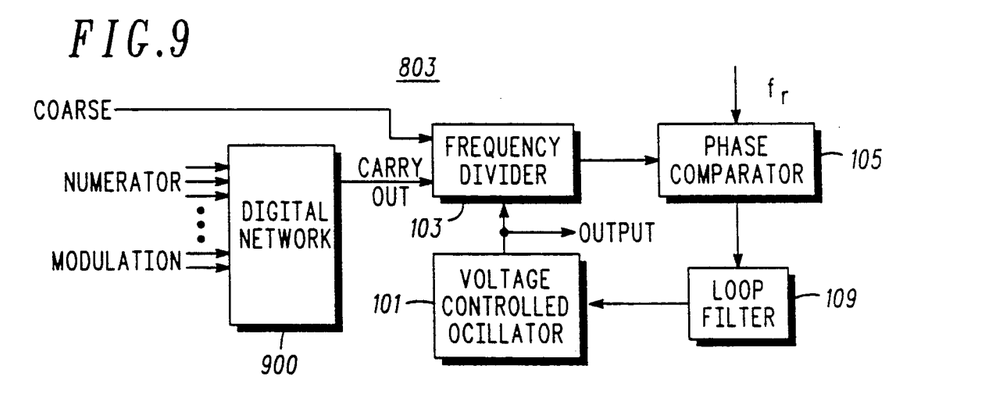
FIG. 9 is a block diagram of a fractional-N synthesizer for the transceiver of FIG. 8 and which may employ the present invention.

The synthesizer 803, in the preferred embodiment, comprises a fractional-N synthesizer having a general configuration shown in FIG. 9. In accordance with the present invention, the digital network 900 is operated in the form of a modified multi order sigma-delta modulator for a fractional-N synthesizer. Since the previous Z-transform equations were shown to be of the same form, a selected portion of the output of a sigma-delta modulator, here, is uniquely used to drive the control of a multi modulus (or continuously programmable) prescaler contained within a PLL synthesizer. This results in a fractional-N synthesizer where the numerator is the number entered as the DATA IN and the denominator is the number to which the quantizer compares.

Figure 10:
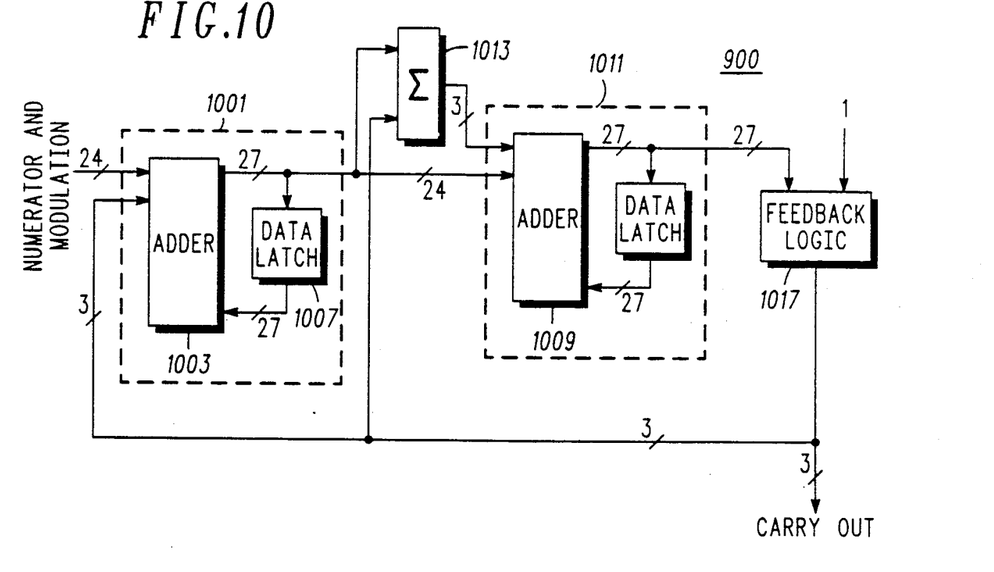
FIG. 10 is a block diagram of a digital network for the synthesizer of FIG. 9 and which may employ the present invention.

Referring now to FIG. 10, a block diagram is shown for a second order (two-accumulator) ripple sigma-delta modulator having an adder length, D, equal to a large number ($2^{24}$). A first accumulator 1001 accepts the twenty four bits input from the transceiver control logic 809 as the twenty-four least significant bits (LSB) to the 27 bit adder 1003 and the three feedback bits are input as the three most significant bits (MSB). The output from adder 1003 (27 bits wide) is input to data latch 1007. This configuration is unlike those previously used for fractional-N synthesis, for example those employing Pascal's triangle recombination, in that the only comparison within the digital network is done at the output and not at intermediate steps.

The output from data latch 1007 is coupled to adder 1003 to enable the accumulator to provide integration of the input NUMERATOR number. The output from adder 1003 is also split into three MSB and twenty four LSB bits; the twenty four LSB are coupled to the adder 1009 of a second accumulator 1011. The three MSB are added to the feedback three MSB in three-bit adder 1013, with the result being coupled to adder 1009. The integrated twenty-seven bit output from the second accumulator 1011 is coupled to 27 bit adder (feedback logic) 1017 which creates a signed three bit output by considering whether the adder 1009 sum is less than $-2D$, less than $-D$, greater than $+D$, or greater than $+2D$. It is important to not that only the three MSB output from feedback logic 1017 are coupled, as CARRY OUT, to the frequency divider 103. The three MSB bits are also fed back from feedback logic 1017 to the first accumulator 1001 and to the three bit adder 1013. Thus, a second order modified sigma-delta modulator—having a Z-transform model as diagrammed in FIG. 7—is used as the digital network in a fractional-N synthesizer (although more than two accumulators may be used without affecting the scope of the present invention). In order for the proper operation of the synthesizer to occur, only the carry out term of the sigma-delta modulator is used in the present invention.

In order to maintain stability, the CARRY OUTPUT to the loop divider and the subtraction from the accumulators on occurrence of the quantization is different from standard fractional-N. In this case the internal contents of the accumulators can range between $-(L+1)*D$ and $+(L+1)*D$, where L is the number of accumulators and D is the denominator. If the output of the last accumulator is equal or greater than the quantizer value then a carry will occur. If it is greater than twice the value then the carry will be double or increase the divider by 2. This repeats through the highest order of accumulator. This process may also occur in the opposite direction if the accumulator is less than or equal to the negative of the quantizer limit. (Also, the feedback to the accumulators is the carry number times the quantizer limit). The end result of this is that the sigma-delta fractional-N synthesizer requires the same range in the loop divider programmability as standard fractional-N with an increase in the accumulator length of $2(L+1)$.

Figure 11:
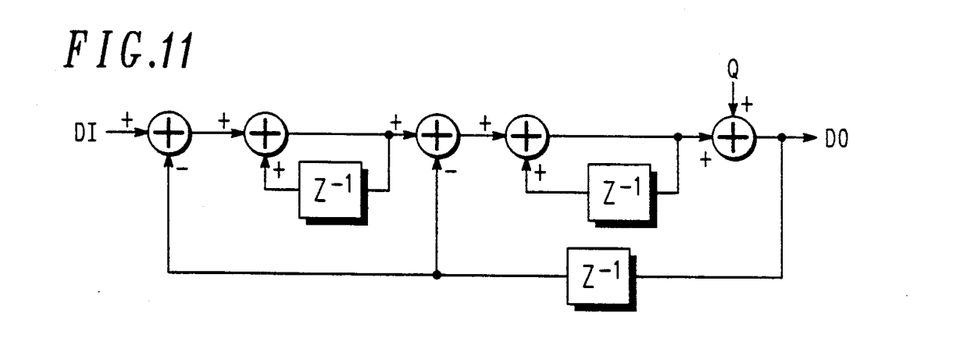
FIG. 11 is a Z-transform diagram of a second order ripple accumulator for the digital network of FIG. 10.
Figure 12:
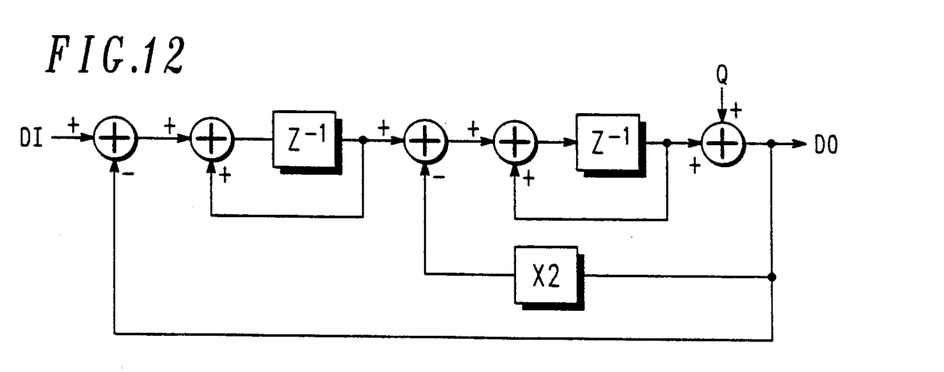
FIG. 12 is a Z-transform diagram of a second order latched accumulator for a digital network which may be employed in the synthesizer of FIG. 9.

The sigma-delta fractional-N synthesizer using the digital network of FIG. 10 operates the internal accumulators 1001 and 1011 in a "ripple" fashion. i.e. any new data must ripple through all accumulators in one clock cycle. A Z-transform diagram of a second order ripple accumulator for the digital network of the sigma delta fractional-N synthesizer of FIG. 10 is shown in FIG. 11. The accumulators may also operate as latched accumulators without departing from the scope of the present invention. A second order latched accumulator sigma-delta modulator for fractional-N synthesis is shown in the Z-transform diagram of FIG. 12.

A latched sigma-delta modulator of Nth order used in an alternative embodiment of a fractional-N synthesizer operates by feeding back the output times the magnitude of the first term in the Nth order Pascal's triangle expansion to the summing input of the first accumulator, feeding back the output times the magnitude of the second term in the expansion to the summing input of the second accumulator and so on until the summing input of the Nth accumulator receives the magnitude of the $(N-1)$th term.

As above for the non-latched sigma-delta modulator, the range of the accumulators is $+/-(L+1)*D$ and the modulus range of the programmable loop divider is the same as standard fractional division.

For the multiple accumulator sigma-delta fractional-N synthesizer of the present invention (as shown in FIG. 9), the modulation information is applied to the digital network 900 of the fractional-N synthesizer as the sixteen least significant bits of the twenty-four LSB of the channel control NUMERATOR from the transceiver control logic 809. In the GSM system, the data rate is 270.83333 kb with a BT product of 0.3. This results in a frequency of about 81 kHz which must be passed with low distortion through the PLL as modulation.

The actual frequency offset components of the GMSK signal range from 10 Hz to about 70 kHz. This range determines the length of the accumulators as it will be necessary to synthesize steps of less than 10 Hz. In the preferred embodiment of the GSM system, with a reference frequency of 26 MHz, the accumulator length is 24 bits but, as a minimum, must be at least 22 bits.

Obviously, the desired instantaneous frequency offsets due to the modulation are well below the cutoff of the loop filter. Therefore the PLL does not attenuate any of the fundamental frequency "channelization" spurious signals due to the modulation. However, with a multiple accumulator system this problem is overcome.

It is possible, and preferable, to increase the fractionalization (the value of the denominator of the fractional part of the division) such that all spurious outputs are moved to very low frequencies where the combined effects of using many accumulators at a high rate of operation results in a large attenuation of the quantization noise of the fractional process. Thus, the large denominator effectively divides the frequency of the reference oscillator such that spurious signals which are produced fall well below the three decibel corner of the loop high pass characteristic. Using many accumulators increases the slop of the high pass filtering action. Increasing the rate of operation moves the corner frequency of the high pass filter up in frequency.

Referring again to the block diagram of the fractional-N synthesizer of the present invention in FIG. 9, the output of the fractional-N digital network 900 is fed to the division control input of the programmable frequency divider 103. When the digital network 900 causes the division to increase by one for one reference period, one output pulse of the VCO 101 is effectively removed by the frequency divider 103. This action corresponds to a phase shift of $2\pi$ radians at the output frequency of the VCO 101. This phase shift is then divided by the frequency divider 103 such that the phase shift at the phase detector 105 input is $2\pi$ radians divided by the divisor of the frequency divider 103. In general the digital network 900 will generate a time-varying division ratio. Thus in the general case the input to the phase detector 105 may be represented as follows:

$$\frac{2\pi}{sN_L} c(n)$$

where:
$N_L$ is the nominal loop division ratio
$c(n)$ is the Fourier component of the digital sequence at the offset frequency and:
$1/s$ is introduced to convert frequency to phase.

The Fourier components of the digital sequence are calculated as follows:

$$c(n) = \frac{2}{N} \sum_{i=0}^{N-1} \theta(i) \left[ \cos\left(\frac{2\pi i}{N}\right) - j \sin\left(\frac{2\pi i}{N}\right) \right]$$

where:
N is the total number of points in one period of the sequence
$\theta(i)$ is the time waveform of the digital sequence
i is the time component and:
n is the frequency component.

After passing through the phase detector 105 the signal is then input to the loop filter 109. The output of the loop filter 109 feeds the control input of the VCO 101. The magnitude of the controlling error voltage at the input of the VCO 101 is expressed as follows:

$$V_c = \frac{2\pi K_\phi |c(n)| |F(\omega)|}{N_L}$$

where:
$K_\phi$ is the phase detector conversion gain and:
$|F(\omega)|$ is the magnitude of the filter response at the offset frequency.

This control voltage will cause the VCO 101 to output a spurious component as follows:

$$f_{spur}(t) = \frac{2\pi K_\phi K_v}{N_L} |F(\omega)| |c(n)| \cos(\omega_m t)$$

where:
$\omega_m$ is the spurious frequency component of the digital sequence and:
$K_v$ is the conversion gain of the variable oscillator.

The feedback nature of the phase locked loop will correct this such that the spurious component will be as follows:

$$f_{spur}(t) = \frac{\frac{2\pi K_\phi K_v}{N_L} |F(\omega)| |c(n)| \cos(\omega_m t)}{1 + \frac{K_\phi K_v |F(\omega)|}{\omega_m N_L}}$$

For small spurious components the spur level may be approximated as $\beta/2$ where $\beta$ is the phase corresponding to the frequency derived above.

$$\beta = \int f_{spur}(t) dt$$

The spurious levels may thus be approximated as follows:

$$\frac{\beta}{2} = \frac{\frac{\pi K_\phi K_v}{N_L \omega_m} |F(\omega)| |c(n)|}{1 + \frac{K_\phi K_v |F(\omega)|}{\omega_m N_L}}$$

for low frequencies $F(\omega) \to \infty$ and $\omega_m \to 0$. Thus the spurious level can be approximated as follows:

$$\frac{\beta}{2} = 2\pi |c(n)|$$

Thus, if the Fourier components of the digital network 900 are shaped such that all spurious components are small valued, then the output of the phase locked loop will also contain small spurious values. The digital network 900 behaves as a high pass filter to the quantization noise. By increasing the fractionalization to a very large number all spurious signals will be located at frequency offsets where the fractional sequence generator attenuates the spurious levels to below that of the noise floor of the phase locked loop. After passing to the phase locked loop output, the spurious signals still retain the level established by the fractional sequence generator.

In the preferred embodiment, the phase detector operates at 26 MHz supplied by reference oscillator 107, and fractionalization is by a large number. ($2^{24} = 16,777,216$.) The fractional-N spurious signals occur at harmonics and subharmonics of 1.54972 Hertz.

Since the reference is at a very high frequency, the high pass corner of the fractional-N digital network 900 occurs at about 6.5 MHz. The attenuation of spurious signals caused by the fractionalization is, therefore, extremely large.

Elimination of spurious signals by the use of the digital network 900 high pass nature has important advantages. First, the channel spacing is much smaller than the minimum required frequency step for low distortion modulation. Second, the loop bandwidth is extremely wide since there are no discrete spurious signals above the noise floor of the phase locked loop which need to be rejected. (Except for the spur at the actual reference which is 26 MHz). In the preferred embodiment, an open loop unity gain frequency of 400 kHz causes a 5 degrees peak and 3.5 degrees RMS phase error to the GMSK signal. This is a reasonable limit given the GSM specifications of 20 degrees peak and 5 degrees RMS. The RMS value of 3.5 degrees is very reliable in that it is determined by the wide loop bandwidth.

A problem could develop with a system designed for very high fractionalization in that some channel offsets would result in a common factor of the numerator and denominator. This would result in an effective fractionalization which is much less than that desired and the discrete spurious signals would re-appear. This situation can be avoided by setting the least significant bit of the accumulator. As an example consider the above situation in which a channel requires a fractional offset of $\frac{1}{4}$. This would result in spurious outputs at harmonics and subharmonics of 6.5 MHz. If the LSB is set the fractionalization will become 4,194,305/16,777,216 which will move the spurious signals back to the 1 Hz region. This will result in a small frequency error, but for most cases this kind of error is insignificant.

A second method of ensuring high fractionalization is to initially offset the accumulators with a number, or group of numbers, and then input the desired frequency data. This initial offset will cause a fractional-N accumulator which contains two or more internal accumulators to generate a spurious pattern corresponding to that of its full accumulator length for almost any value of the input data. In a multiple accumulator system the initial offset of the bottom bit (or bits) will result in an essentially random pattern imposed on the offset data. This method will not cause a frequency error since the initial offset is removed once the data is fed into the system. Note that this method will not work for a one accumulator system because in a one accumulator system the waveform corresponds to a simple sawtooth which will return to the same waveform regardless of the initial offset. With many accumulators the offset will set up a multitude of patterns which will interact to form very long time sequences with correspondingly low frequency spectral components which will be rejected in the digital network 111.

We claim:

1. A fractional-N synthesizer which divides a voltage controlled oscillator output signal frequency by a loop divider, the loop divider having a variable divisor controlled by a control input to create a feedback signal to be compared to a reference signal for frequency control of the voltage controlled oscillator, the fractional-N synthesizer comprising:

means for accepting a first digital number presented as a first plurality of bits;
   means, including sigma-delta modulator means, for:
   (a) calculating an integral of a combination of a predetermined number of least significant bits of said first digital number and a control digital number, to produce a second digital number,
   (b) summing a predetermined number of most significant bits of said second digital number with said control digital number to produce a sum digital number, and
   (c) calculating an integral of a combination of a predetermined number of least significant bits of said second digital number and said sum digital number whereby a third digital number, related to a second integral of said first digital number, is produced; and
   means for selecting a predetermined number of most significant bits of said third digital number for coupling to the divisor control input of the loop divider and for coupling to said sigma-delta modulator means as said control digital number.

2. A fractional-N synthesizer in accordance with claim 1 further comprising means for modulating the output signal by time varying at least one bit of said first digital number.

3. A fractional-N synthesizer in accordance with claim 1 wherein said sigma-delta modulator means further comprises at least two accumulators.

4. A fractional-N synthesizer in accordance with claim 3 wherein said at least two accumulators further comprise a ripple accumulator and a latched accumulator.

5. A fractional-N synthesizer in accordance with claim 3 wherein said at least two accumulators further comprise at least two ripple accumulators.

6. A fractional-N synthesizer in accordance with claim 3 wherein said at least two accumulators further comprise at least two latched accumulators.

7. A fractional-N synthesizer in accordance with claim 3 wherein said at least two accumulators are clocked from the divided voltage controlled oscillator output signal frequency.

8. A fractional-N synthesizer in accordance with claim 3 further comprising means for generating a residual quantization noise correction signal.

9. A fractional-N synthesizer in accordance with claim 8 wherein said means for generating a residual quantization noise correction signal further comprises means for subtracting said first digital number from the internal contents of one of said at least two accumulators.

10. A fractional-N synthesizer in accordance with claim 3 wherein the variable divisor has an average value represented by the sum of an integer and a quotient of a numerator divided by a denominator.

11. A fractional-N synthesizer in accordance with claim 10 wherein said denominator of said variable divisor is of a large value such that the frequency of the quotient of the reference signal frequency divided by said denominator is much less than the corner frequency of a highpass characteristic of the fractional-N synthesizer whereby spurious signals in the output signal are rejected.

12. A fractional-N synthesizer in accordance with claim 11 further comprising means for maintaining said denominator for a multiplicity of numerator values by selecting a predetermined state for at least one bit of said first digital number.

13. A fractional-N synthesizer which divides a voltage controlled oscillator output signal frequency by a loop divider, the loop divider having a variable divisor controlled by a control input to create a feedback signal to be compared to a reference signal for frequency control of the voltage controlled oscillator, the fractional-N synthesizer comprising:

means for accepting a first digital number presented as a first plurality of bits;

means for calculating a first integration of an addition of said first digital number and a predetermined number of most significant bits of a second digital number having a second plurality of bits, to create a third digital number comprising a third plurality of bits;

means for calculating a second integration of an addition of a predetermined number of least significant bits of said third digital number and a summation of a predetermined number of most significant bits of said third digital number and said predetermined number of most significant bits of said second digital number, to create said second digital number; and     means for selecting said predetermined number of most significant bits of said second digital number for coupling at least to the divisor control input of the loop divider.

14. A fractional-N synthesizer in accordance with claim 13 further comprising means for modulating the output signal by time varying at least one bit of said first digital number.

15. A fractional-N synthesizer in accordance with claim 13 wherein said means for calculating a first integration further comprises a ripple accumulator and said means for calculating a second integration further comprises a latched accumulator whereby the contents of said ripple accumulator are input to said latched accumulator, a carry output of said latched accumulator being fed back to an input of said ripple accumulator and an input of said latched accumulator.

16. A fractional-N synthesizer in accordance with claim 13 wherein said means for calculating a first integration and means for calculating a second integration each further comprise a ripple accumulator whereby the contents of a first accumulator are input to a second accumulator and a carry output of said second accumulator is time delayed and fed back to the input of at least said first accumulator.

17. A fractional-N synthesizer in accordance with claim 13 wherein said means for calculating a first integration and means for calculating a second integration each further comprise at least two latched accumulators whereby the contents of a first accumulator are time delayed and input to a second accumulator and a carry output of said second accumulator is multiplied and fed back to the input of at least said first accumulator.

18. A fractional-N synthesizer in accordance with claim 13 wherein said means for calculating a first integration and said means for calculating a second integration are clocked from the divided voltage controlled oscillator output signal frequency.

19. A fractional-N synthesizer in accordance with claim 13 further comprising means for generating a residual quantization noise correction signal.

20. A fractional-N synthesizer in accordance with claim 19 wherein said means for generating a residual quantization noise correction signal further comprises means for subtracting said first digital number from the internal contents of at least one of said means for calculating a first integration and said means for calculating a second integration.

21. A fractional-N synthesizer in accordance with claim 13 wherein the variable divisor has an average value represented by the sum of an integer and a quotient of a numerator divided by a denominator.

22. A fractional-N synthesizer in accordance with claim 21 wherein said denominator of said variable divisor is of a large value such that the frequency of the quotient of the reference signal frequency divided by said denominator is much less than the corner frequency of a highpass characteristic of the fractional-N synthesizer whereby spurious signals in the output signal are rejected.

23. A fractional-N synthesizer in accordance with claim 22 further comprising means for maintaining said denominator for a multiplicity of numerator values by selecting a predetermined state for at least one bit of said first digital number.

24. A radio transceiver employing a fractional-N synthesizer to generate an operating frequency signal derived from a voltage controlled oscillator output signal, the fractional-N synthesizer dividing the voltage controlled oscillator output signal frequency by a loop divider, the loop divider having a variable divisor controlled by a control input to create a feedback signal to be compared to a reference signal for frequency control of the voltage controlled oscillator, the radio transceiver comprising:

means for transmitting the operating frequency signal;

means for accepting a first digital number presented as a first plurality of bits to determine, in part, the operating frequency signal;

means, including sigma-delta modulator means, for:

(a) calculating an integral of a combination of a predetermined number of least significant bits of said first digital number and a control digital number, to produce a second digital number,         (b) summing a predetermined number of most significant bits of said second digital number with said control digital number to produce a sum digital number, and         (c) calculating an integral of a combination of a predetermined number of least significant bits of said second digital number and said sum digital number whereby a third digital number, related to a second integral of said first digital number, is produced; and     means for selecting a predetermined number of most significant bits of said third digital number for coupling to the divisor control input of the loop divider and for coupling to said sigma-delta modulator means as said control digital number.

25. A radio transceiver in accordance with claim 24 further comprising means for modulating the operating frequency signal by time varying at least one bit of said first digital number.

26. A radio transceiver in accordance with claim 24 wherein said sigma-delta modulator means further comprises at least two accumulators.

27. A radio transceiver in accordance with claim 26 wherein said at least two accumulators further comprise a ripple accumulator and a latched accumulator.

28. A radio transceiver in accordance with claim 26 wherein said at least two accumulators further comprise at least two ripple accumulators.

29. A radio transceiver in accordance with claim 26 wherein said at least two accumulators further comprise at least two latched accumulators.

30. A radio transceiver in accordance with claim 26 wherein said at least two accumulators are clocked from the divided voltage controlled oscillator output signal frequency.

31. A radio transceiver in accordance with claim 26 further comprising means for generating a residual quantization noise correction signal.

32. A radio transceiver in accordance with claim 31 wherein said means for generating a residual quantization noise correction signal further comprises means for substracting said digital number from the internal contents of one of said at least two accumulators.

33. A radio transceiver in accordance with claim 26 wherein said variable divisor has an average value represented by the sum of an integer and a quotient of a numerator divided by a denominator.

34. A radio transceiver in accordance with claim 33 wherein said denominator of said variable divisor is of a large value such that the frequency of the quotient of the reference signal frequency divided by said denominator is much less than the corner frequency of a highpass characteristic of the fractional-N synthesizer whereby spurious signals in the output signal are rejected.

35. A radio transceiver in accordance with claim 34 further comprising means for maintaining said denominator for a multiplicity of numerator values by selecting a predetermined state for at least one bit of said first digital number.

36. A method of signal synthesis employing a fractional-N synthesizer which divides a voltage controlled oscillator output signal frequency by a loop divider, the loop divider having a variable divisor controlled by a control input to create a feedback signal to be compared to a reference signal for frequency control of the voltage controlled oscillator, the method comprising the steps of:

accepting a first digital number presented as a first plurality of bits;
calculating a first integration of an addition of said first digital number and a predetermined number of most significant bits of a second digital number having a second plurality of bits, to create a third digital number comprising a third plurality of bits;
calculating a second integration of an addition of a predetermined number of least significant bits of said third digital number and a summation of a predetermined number of most significant bits of said third digital number and said predetermined number of most significant bits of said second digital number, to create said third digital number; and
selecting said predetermined number of most significant bits of said third digital number for coupling at least to the divisor control input of the loop divider.

37. A method in accordance with claim 36 further comprising the step of modulating the output signal by time-varying at least one bit of said first digital number.

38. A method in accordance with claim 36 further comprising the step of generating a residual quantization noise correction signal.

39. A method in accordance with claim 36 further comprising the step of generating the variable divisor such that the variable divisor has an average value represented by the sum of an integer and a quotient of a numerator divided by a denominator.

40. A method in accordance with claim 39 further comprising the step of dividing the reference signal frequency by said denominator of said variable divisor, said denominator having a large value such that the magnitude of the frequency of the quotient is much less than the corner frequency of a highpass characteristic of the fractional-N synthesizer whereby spurious signals in the output signal are rejected.

41. A method in accordance with claim 40 further comprising the step of maintaining said denominator for a multiplicity of numerator values by selecting a predetermined state for at least one bit of said first digital number.

* * * * *